United States Patent [19]

Kalyanaraman

[11] Patent Number: 4,631,249
[45] Date of Patent: * Dec. 23, 1986

[54] PROCESS FOR FORMING THERMALLY STABLE NEGATIVE IMAGES ON SURFACES UTILIZING POLYGLUTARIMIDE POLYMER IN PHOTORESIST COMPOSITION

[75] Inventor: Palaiyur S. Kalyanaraman, Chalfont, Pa.

[73] Assignee: Rohm & Haas Company, Philadelphia, Pa.

[ * ] Notice: The portion of the term of this patent subsequent to Jun. 18, 2002 has been disclaimed.

[21] Appl. No.: 797,731

[22] Filed: Nov. 14, 1985

Related U.S. Application Data

[62] Division of Ser. No. 571,053, Jan. 5, 1984, Pat. No. 4,569,897.

[51] Int. Cl.$^4$ .................................................. G03F 7/26
[52] U.S. Cl. .................................... 430/325; 430/156; 430/167; 430/312; 430/323; 430/330
[58] Field of Search ............... 430/325, 326, 197, 194, 430/270, 281, 286, 297, 330, 323, 312, 156, 167

[56] References Cited

U.S. PATENT DOCUMENTS

| | | | |
|---|---|---|---|
| 2,848,328 | 8/1958 | Hepher | 430/197 |
| 2,852,379 | 9/1958 | Hepher et al. | 430/197 |
| 3,702,766 | 11/1972 | Dunham et al. | 430/197 |
| 3,869,292 | 3/1975 | Peters | 430/192 |
| 3,964,908 | 6/1976 | Bargon et al. | 430/296 |
| 4,079,041 | 3/1978 | Baumann et al. | 430/270 |
| 4,197,133 | 4/1980 | Zweifel et al. | 430/197 |
| 4,246,374 | 1/1981 | Kopchik | 525/77 |
| 4,524,121 | 6/1985 | Gleim et al. | 430/270 |
| 4,547,455 | 10/1985 | Hiramoto et al. | 430/325 |

Primary Examiner—Charles L. Bowers, Jr.
Attorney, Agent, or Firm—Marc S. Adler

[57] ABSTRACT

This invention relates to negative photoresist systems containing thermally stable polyglutarimide polymers dissolved in suitable solvents. The negative resists are useful for producing high resolution images on surfaces by exposing the resist to a wide range of exposing radiation wavelengths and by subsequently developing the unexposed resist with an organic solvent or an aqueous base developer. The polyglutarimide polymers can be formulated so that they are partially soluble in an aqueous base, compatible with aqueous base soluble photosensitizers, and developable in aqueous base solutions, thereby eliminating the need for the use of any organic solvent.

6 Claims, No Drawings

PROCESS FOR FORMING THERMALLY STABLE NEGATIVE IMAGES ON SURFACES UTILIZING POLYGLUTARIMIDE POLYMER IN PHOTORESIST COMPOSITION

This is a division of application Ser. No. 571,053 filed Jan. 5, 1984, U.S. Pat. No. 4,569,897.

FIELD OF THE INVENTION

This invention relates to negative photoresist systems, and more particularly to negative photoresist systems containing imidized acrylic polymers which possess high thermal stability, etch resistance and image resolution.

BACKGROUND OF THE INVENTION

Negative-acting photoresists, commonly referred to as negative resists, are useful in photolithographic and photomasking operations in fabricating microelectronic devices, printed circuits, semiconductors, printing plates, dies and the like. Negative resists typically contain a coupler resin and a photosensitizer compound dissolved in an organic solvent. The negative resist film is deposited from the solvent on the surface of a suitable substrate as by spin casting, dipping, spraying or screen printing. In microelectronic applications, the substrate is typically a silicon or modified silicon plate or wafer and, in printed circuit applications, a metal-clad plastic. After the film is deposited and the solvent is removed as by evaporation by the application of elevated temperatures ("softbake"), a portion of the film is exposed to a source of radiation, such as ultraviolet light, through a photomask. The photosensitizer in the resist is selected because of its ability to absorb the exposing radiation and cause the coupler resin to become insoluble in a solvent that will dissolve the unexposed portions of the resist film. The conversion of the exposed film is typically caused by a crosslinking reaction of the coupler resin with the activated photosensitizer compound. The unexposed portion of the film is then removed by the application of a solvent, known as a developer, to form an image on the surface. The imaged surface may then be treated, as by etching, ion implantation or other processes useful in the production of a functional integrated circuit. Following this treatment, the remaining exposed resist film may be removed or stripped by a suitable solvent.

DESCRIPTION OF THE PRIOR ART

Many different types of coupler resins have been proposed for use in negative resist systems. Conventional polymeric coupler resins include cyclized polyisoprene (U.S. Pat. Nos. 2,852,379 and 2,940,853) chloromethylated polystyrene, N-allyl maleimides (U.S. Pat. Nos. 3,832,187; 3,902,920 and 3,905,820), n-halocyclic imides (U.S. Pat. No. 3,702,766) and mixtures of N-maleimides and triallyl cynaurate prepolymers (U.S. Pat. No. 4,072,524). Photosensitizers which have been found useful in negative resist systems include organic solvent soluble compounds such as Michler's ketone (4,4'-bis dimethylamino benzophenone), 2,6-bis-p-azidobenzal-4-methyl cyclohexanone, 2-tertbutyl-9,10 anthraquinone, 1,2-benzo-9,10-anthraquinone, 2-keto-3-methyl-1,3-diazobenzoanthrone, p-nitrodiphenyl, and the like. The coupler resin and photosensitizer are dissolved in common organic solvents such as lower alcohols, ketones, dimethylformamide, tetrahydrofuran, pyridine, benzene, toluene, mixtures thereof and the like. In general, any number of organic, non-reacting solvents in which the coupler resin and photosensitizer are soluble and which can act as an effective vehicle for the deposition of a photoresist film on a surface can be employed.

While a number of these negative resists have been employed in manufacturing semiconductor and integrated circuit devices, the limitations of these systems have become increasingly more apparent. Because of the increasing miniaturization of circuitry, the need for image resolution on the order of a few micrometers, preferably as low as one to two micrometers, is required. Most conventional negative resists are not capable of achieving such high image resolutions because the organic solvent developers utilized tend to swell the crosslinked resist thereby reducing image resolution. The organic solvents used in depositing and developing conventional negative resists also present potential health, environmental and flammability problems. Conventional negative resists also suffer from inadequate resistance to the high temperatures encountered in semiconductor processing.

Thermal stability of the resist is important in achieving high image resolution when the resist is processed. If the processing temperature exceeds the glass transition temperature of the crosslinked coupler resin, the exposed resist layer will begin to melt or flow. Flow of the resist layer leads to reduced image resolution. The resist must also possess good resistance to etching accomplished either by wet etching, utilizing buffered aqueous hydrofluoric acid solutions containing hydrogen fluoride and ammonia, or dry plasma or reactive ion etching.

It is therefore, an object of this invention to provide a negative resist which solves the problems encountered by those skilled in the art of negative resists.

It is also an object of the invention to provide a negative resist system which is capable of depositing an adhesive, high quality, stable film on a substrate surface which provides high image resolution and etch resistance.

It is a further object of the invention to provide negative resist systems that minimize and eliminate the need for organic solvents to deposit and develop negative resists.

SUMMARY OF THE INVENTION

Thermally stable, negative resist systems, containing imidized acrylic polymers dissolved in suitable solvents, with and without negative-acting photosensitizers, are provided. A critical aspect of this invention is the discovery that imidized acrylic polymer-based negative resists can be formulated and developed with aqueous solvents eliminating the need for organic solvents while maintaining high image resolution, excellent adhesion, thermal stability and etch resistance.

DETAILED DESCRIPTION OF THE INVENTION

I have found that imidized acrylic polymers, referred to herein as polyglutarimides, can be mixed with negative acting photosensitizers and dissolved in selected solvents to form a novel negative photoresist system useful for depositing an adherent, thermally stable, high quality film on a substrate surface, and that such a film is capable of producing high quality images.

The polyglutarimides of the negative photoresist system include the imidized acrylic polymers described in U.S. Pat. No. 4,246,374 to Kopchik, the disclosure of which is incorporated in pertinent part by reference herein. The polyglutarimide must have at least about five percent by weight glutarimide units of the following structural formula:

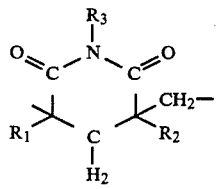

where $R_1$, $R_2$, and $R_3$ independently represent hydrogen or unsubstituted or substituted alkyl, aryl, aralkyl or alkaryl hydrocarbons having from one to twenty carbon atoms or mixtures thereof. Polyglutarimides are formed by reacting an acrylic polymer containing units derived from esters of acrylic or methacrylic acid, such as polymethyl methacrylate homopolymer or copolymers of polymethyl methacrylate, with ammonia, primary amines or mixtures thereof. Polyglutarimides can be prepared so that they are soluble in aqueous solutions when at least about 20 weight percent and preferably 50 weight percent or more of the $R_3$ substituent of the glutarimide units are hydrogen. This is accomplished when the acrylic polymer is imidized with ammonia or with equal amounts of ammonia and an alkyl amine. It is preferable to prepare the polyglutarimides by imidizing polymethyl methacrylate with ammonia to obtain the optimum degree of aqueous solubility. Mixtures of ammonia derived and alkyl amine derived polyglutarimides can be prepared and used to adjust the other physical properties of the photoresist.

The polyglutarimides may be prepared by a continuous extrusion process, as described in U.S. Pat. No. 4,246,374. The degree of imidization of the polyglutarimide can be adjusted by varying the process conditions such as residence time, pressures and temperatures. Polyglutarimides with from about 80 to about 95 percent imidization can be readily achieved by converting the ester moieties of the acrylic polymer to glutarimide units.

The physical properties of the resulting photoresist film can also be adjusted by varying the molecular weight of the polyglutarimide. Typically, the molecular weight of the polyglutarimide is equal to or approximates the molecular weight of the precursor acrylic polymer. Therefore, by selecting an acrylic polymer of known molecular weight, the film properties of the negative resist can be optimized for each admixture of polyglutarimide and photosensitizer dissolved in selected solvent. Typically, the molecular weight of the polyglutarimides useful in the negative resists of the invention range from about 2,000 to about 500,000 weight average molecular weight, and more preferably, from about 5,000 to about 200,000 weight average molecular weight.

One of the distinguishing characteristics of polyglutarimides which makes them especially useful in photoresist systems is their high degree of thermal stability. The thermal stability of a polyglutarimide increases with increasing percent imidization. A 95 percent imidized polyglutarimide, derived from ammonia, has a glass transition temperature (Tg) of about 250° C. and a Tg midpoint of 231° C. as determined by Differential Scanning Calorimetry (DSC). A nearly completely imidized polyglutarimide, 95% imidization, derived from n-methylamine has a Tg of about 180° C. Depending on the process conditions, the ratio of ammonia to alkyl amine, and the type of acrylic polymer precursors and the extent of imidization, the thermal stability of the polyglutarimide, as determined by its glass transition temperature or VICAT softening point (ASTM DI 525-70), can range from about 130° C. to about 250° C. It is preferable to use polyglutarimides which are at least 80 percent imidized with a Tg of at least 140° C., preferably up to about 180° C., and in certain cases, as for example when reactive ion etching is utilized, even more preferably up to about 240° C. The thermal stability of the polyglutarimide is important when high image resolution of less than four micrometers is desired. Thermally stable photoresist films prevent flow of the film when the film is exposed to high surface temperatures such as when ion implantation or reactive ion etching is utilized. Ion doping or implantation of the silicon wafer surface is used to improve the electrical conductivity of the silicon wafer. Doping of the silicon is achieved by implanting conductive ions, such as phosphorus or boron ions, into the exposed silicon wafer surface. The rate at which such ions can be implanted into the silicon surface is a function of the thermal stability of the photoresist layer. Ion implantation leads to high film surface temperatures which can lead to deformation of the images. If the photoresist film begins to flow during ion implantation, the level of doping and electrical properties of the wafer, as well as image resolution, will suffer.

In addition, reactive ion etching also requires a highly thermally stable photoresist film. Polyglutarimide resist films are highly resistant to reactive ion etching and allow the substrate to be rapidly etched giving increased wafer throughput and lower processing costs.

The polyglutarimide and the conventional, negative-acting photosensitizer in the resist film react upon exposure of a portion of the film to selected radiation. Upon exposure of the resist film to the selected radiation, the solubility of the polyglutarimide polymer in a developer decreases to a point that the product can be termed insoluble in the developer. The insoluble reaction product is not soluble in the developing solution, such as an aqueous base or a non-aqueous solvent, and development of the unexposed portions in the developer results in the formation of images on the substrate. The ability of the polyglutarimide to crosslink with the activated photosensitizers can be enhanced by substitution of the $R_3$ hydrogen substituents of the glutarimide units with suitable unsaturated compounds (referred to herein as "functionalization"). Suitable unsaturated compounds include alkenyl halides and alkenyl aromatic halides such as allyl, crotyl, butenyl and cinnamyl bromide. This functionalization reaction is conducted by reacting the ammonia derived glutarimide units ($R_3$ substituent is hydrogen) with the unsaturated compound in a solvent, such as dimethylformamide, using a catalyst such as potassium carbonate. The fraction of the $R_3$ substituents which are substituted by the unsaturated compound may be controlled either by varying the percentage of the hydrogen $R_3$ substituents in the polyglutarimide starting material or by adjusting the ratio of unsaturated compound reactant to hydrogen $R_3$ substituent. If fewer moles of the unsaturated compound are used than the moles of hydrogen $R_3$ substituent then the resulting substituted polyglutarimide will still contain some unsubstituted hydrogen $R_3$ substituents.

Partially functionalized polyglutarimides, containing at least about 20 weight percent unsubstituted hydrogen $R_3$ substituents after partial functionalization, can be mixed with water soluble negative photosensitizer compounds, such as those described in U.S. Pat. No. 3,917,794 and dissolved in an aqueous base solution to form the negative photoresist system. This aqueous-formulated negative photoresist system can be deposited on a substrate to form an adherent, high quality film which can be exposed and developed using an aqueous base developer. This system completely avoids the need for any organic solvent to either formulate the negative resist system or to develop the exposed film deposited therefrom. The aqueous base developer does not induce swelling of the exposed film reducing image resolution and the polyglutarimide assures high temperature stability and etch resistance to the resist film. These partially functionalized polyglutarimides can alternatively be dissolved in a suitable organic solvent with a photosensitizer and such a resist system can be developed using an organic solvent developer.

If the polyglutarimide is completely functionalized with an unsaturated compound, leaving less than about 20 weight percent hydrogen $R_3$ substituents, the polyglutarimide is not soluble in water and therefore must be dissolved in an organic solvent and may be used with an organic solvent-soluble negative-acting photosensitizer to form a photoresist system of the present invention. This negative photoresist system exhibits rapid crosslinking upon exposure, but requires organic solvent developers. The completely functionalized polyglutarimide dissolved in an organic solvent can be used as a negative photoresist system without the addition of a photosensitizer. When this negative resist is exposed to deep UV radiation, the exposed, functionalized polyglutarimide becomes insoluble and images can be created on the substrate by subsequent development of the resist.

In the case where the polyglutarimide is not functionalized and contains at least about 20 weight percent hydrogen $R_3$ substituents, the resist is typically formulated using an organic solvent and organic solvent soluble photosensitizer. The deposited resist film can be developed using an aqueous base developer.

Therefore, according to the structure of the polyglutarimide, the extent of functionalization, the selection of a compatible negative-acting photosensitizer and the exposing radiation employed, negative resists capable of being formulated and developed using aqueous or organic solutions can be employed.

The negative-acting photosensitizers which are useful with the polyglutarimides in the negative resists of the invention include conventional azides and bisazides. When the negative resist is formulated with an organic solvent, the negative-acting photosensitizers are selected based on their compatibility with the polyglutarimide and their solubility in the organic solvent which dissolves the polyglutarimide. The photosensitizer may be sensitive to either near UV, mid UV or deep UV radiation. Near UV as used in this application refers to ultraviolet light having a wavelength ranging from about 310 to about 465 nanometers, mid UV refers to ultraviolet light having a wavelength range of from about 280 to about 310 nanometers, and deep UV refers to ultraviolet light having a wavelength ranging from about 230 to about 280 nanometers. Useful negative-acting near UV photosensitizers include 2,6-bis(4-azidyl benzylidene)-4-methyl cyclohexanone, and others such as those described in U.S. Pat. Nos. 4,329,419 and 3,669,669 and *Photoresist Materials and Processes*, W. S. DeForest, McGraw-Hill Book Company, 1975, chapter 2, pages 38–40. Useful negative-acting deep UV photosensitizers include 3,3'-diaziododiphenyl sulfone and others such as those described in T. Iwayanagi et al, *J. Electrochem. Soc.*, Vol. 127, page 2759 (1980). When the negative resist is formulated with an aqueous base, the negative-acting photosensitizers include water-soluble bisazides such as 4,4'-diazido-stilbene-2,2'-disodium sulfonate (near UV) and others such as those described in U.S. Pat. No. 3,917,794.

Organic solvents useful for forming the negative photoresist system, include N-methyl pyrrolidinone (NMP), N,N-dimethyl acetamide (DMAC), dimethylformamide (DMF), cyclopentanone, cyclohexanone, methyl carbitol, 2-methoxyethanol, tetrahydrofuran, tetrahydrofurfuryl alcohol, chlorobenzene, cellosolve acetate, xylene, butylacetate and mixtures thereof.

Typically, the polyglutarimide is dissolved in the solvent, organic or aqueous as the case be, to prepare a 5 to about 30 weight percent solution. The sensitizer is typically added to the solution at concentrations of from about 1 to about 50 weight percent, and preferably from about 1 to about 10 weight percent, based on the amount of the polyglutarimide. Other additives such as adhesion promoters and plasticizers may also be added to the photoresist system.

The negative resist system is capable of being spun cast from the solution onto an oxide coated, nitride coated or uncoated silicon wafer, or onto aluminum coated substrates, to deposit the resist film. Adhesion promoting primers such as hexamethyl disilazane (HMDS), beta-3,4-epoxy cyclohexyl ethyl trimethoxy silane, and the like can alternatively be spun onto the substrate prior to depositing the resist film. The thickness of the film deposited can be controlled by adjusting the level of polyglutarimide and sensitizer solids in the solution and by modifying the deposition technique such as the speed of spin casting.

Any conventional spin casting method such as those described in *Integrated Circuit Fabrication Technology*, D. J. Elliott, McGraw-Hill Book Company, 1982, chapter 6, pages 125–144, can be utilized with the photoresist system of the invention.

Typically, the wafer is placed on a rotating disc, such as a Headway ® wafer spinner, and rotated at speeds of from about 2,000 to about 7,000 revolutions per minute for from about one-half a minute to about one minute. The photoresist system is introduced onto the wafer, by either a continuous or dropwise addition while the wafer is stationary, or while it is spinning, to deposit the film of uniform thickness on the wafer. The thickness of the deposited film will generally range from about 0.5 micrometer to about 3 micrometers. The film is then heated for about 15 to about 60 minutes at temperatures of about 60° C. to about 120° C. (referred to as a "soft bake") to reduce the solvent content of the film. The film thus deposited is uniform, striation-free and free from pinholes and voids which could lead to reduced quality and yields during processing.

The film is then exposed to radiation through a suitable photomask. The radiation activates the photosensitizer and causes insolubilization, typically by a crosslinking reaction, of the exposed film to the developer.

The unexposed film areas remain soluble in the developing solution. The film is then developed in any conventional manner such as by immersion to form the images. The imaged wafer is then "postbaked" such as in a forced air oven at about 150° C. to about 180° C. for about one hour. If desired, the wafer can be "hardbaked" at temperatures up to about 250° C. for about one half an hour without any noticeable image distortion. Following the postbaking and optional hard-baking steps, the wafer can be wet etched or dry etched to remove the oxide from the unexposed areas of the oxidized substrate. It is also possible to utilize the negative resist systems of the invention as thin top layers in multi-layer photoresist systems with compatible negative or positive resist planarizing layers.

The following examples are presented solely to illustrate the invention and should not be considered to constitute limitations on the scope of the invention.

EXAMPLE 1

Complete Functionalization of Polyglutarimide

The starting polyglutarimide polymer (Polymer I) having a molecular weight of 71,000 and a Tg of 199° C. (Differential Scanning Calorimetry) was prepared with 86% imidization, from polymethyl methacrylate and ammonia in an extruder, according to the process described in U.S. Pat. No. 4,246,374. The polyglutarimide contained 58 mole % NH ($R_3$=H) and 42 mole % $NCH_3$ ($R_3$=$CH_3$) groups. 15.3 grams of Polymer I were dissolved in 225 grams of dimethylformamide (DMF) by heating to 70° C. and stirring under anhydrous conditions. To this solution was added 9 grams of anhydrous potassium carbonate followed by the dropwise addition of 15 grams of allyl bromide. The mixture was stirred and heated at 70° C. for 16 hours. Following this, the mixture was cooled to ambient temperature and poured with stirring into one liter of water acidified with 20 ml. of hydrochloric acid. The white precipitate that formed was filtered using a Whatman No. 1 filter, washed five times with 300 ml. of deionized water, dried in vacuum, and transferred to a 1 liter flask. To the flask, 500 ml. of methanol was added and the contents were stirred for 30 minutes. After similar filtration and drying steps, the product was weighed and analyzed by NMR which showed the complete substitution by the N-allyl groups. The product weighed 15 grams and contained 7.34 weight % nitrogen. One hundred percent allyl functionalization of the polyglutarimide was calculated to produce a product containing 7.25 weight percent nitrogen.

I also prepared completely functionalized polyglutarimides utilizing the above procedure with n-crotyl bromide, n-butenyl bromide, and n-cinnamyl bromide in place of the allyl bromide.

EXAMPLE 2

Use of Substituted Polyglutarimide Negative Resist

The completely n-allyl substituted polyglutarimide prepared in example 1 was then used in formulating a negative photoresist. One gram of the n-allyl substituted polyglutarimide was dissolved in 5 grams of dimethylformamide. To this solution was added 0.1 grams of 2,6-bis(4-azidylbenzylidene)-4-methylcyclohexanone sensitizer to form the resist system. The solution was then filtered through a 0.45 micrometer Millipore filter. Two ml. of the resist system was then pipetted onto a three inch diameter silicon water, having a one micrometer thick silicon oxide layer, and spun, using a Headway ® Wafer spinner at 3000 rpm for 60 seconds, to deposit the resist film on the oxide layer. The film was then soft baked at 90° C. for 30 minutes. The resulting resist film had a thickness of 1.45 micrometers as measured by a TenCor Alpha Step Profilometer. The film was clear and striation-free.

A photomask was placed in contact with the photoresist film using an HTG contact printer. The mask had lines and spaces ranging from 0.75 micrometers to 5 micrometers in width. Nitrogen gas was added for 5 seconds and a contact vacuum was established between the mask and the wafer. The film was then exposed through the mask to near UV radiation with an intensity of 20 milliwatts (MW) per $cm^2$ at 365 nanometers for 3 seconds.

The exposed wafer was then immersed in a DMF developer bath for 30 seconds, with hand agitation, removed from the developer bath and air-dried.

The resulting images were then examined using an optical microscope. The image resolution was 2 micrometers and no effects due to swelling were observed. The post-development film thickness was 1.17 micrometers.

Similarly, other negative resists containing completely functionalized polyglutarimides, prepared according to example 1, were formulated with the same bis-azide sensitizer and evaluated as negative resists under the same exposing radiation conditions as above. The results are shown in Table 1.

TABLE 1

| Unsaturated Substituent $R_3$ | Depositing Solvent | Developing Solvent | Film Thickness (Micrometers) | | Minimum Resolution Micrometers |
|---|---|---|---|---|---|
| | | | Initial Thickness | Final Thickness | |
| n-crotyl | cyclopentanone | cyclopentanone (70° C.) | 0.6 | 0.5 | 2 |
| n-butenyl | cyclopentanone | cyclopentanone (70° C.) | 0.6 | 0.5 | 2 |
| n-cinnamyl | cyclopentanone | cyclopentanone (70° C.) | 0.6 | 0.5 | 2 |

EXAMPLE 3

Deep UV Completely Substituted Polyglutarimide Negative Resist (with sensitizer)

The n-allyl substituted polyglutarimide of example 1 was also used to formulate a deep UV sensitive negative resist system. One gram of the polyglutarimide was dissolved in 5 grams of N-methyl pyrrolidinone. To the solution 0.1 grams of 3,3'-diazidodiphenyl sulfone was added. The resist system was filtered through a 0.45 micrometer Millipore filter and 2 ml. of the resist was deposited onto a one micrometer thick oxide coated 3 inch diameter silicon wafer and spun cast at 3000 rpm for 60 seconds. Following a 30 minutes soft bake at 90°

C. the thickness of the film was measured to be 1.1 micrometers. The film was clear and striation free. The resist film was then exposed to deep UV radiation with an intensity of 18 MW/cm$^2$ at 254 nanometers for 2.5 seconds through the contact vacuum mask as described in example 2. The film was developed in a DMF bath for 30 seconds and resulted in image resolution of 2 micrometers with a 0.6 micrometer thick film after development.

EXAMPLE 4

Non-Functionalized-Solvent Formulated/Aqueous Developed Negative Resist

A starting polyglutarimide polymer (Polymer II) having a molecular weight of 33,000 and a Tg of 207° C. (DSC) was prepared with 86% imidization, from polymethacrylic acid and an ammonia precursor in an extruder, according to the process described in U.S. Pat. No. 4,246,374. The polyglutarimide contained 100% ammonia imide ($R_3$=H) groups. One gram of Polymer II was dissolved in 4 grams of dimethylformamide. To this solution was added 0.1 gram of 2,6-bis(4-azidylbenzlidene)-4-methyl cyclohexanone sensitizer. The solution was filtered through a 0.45 micrometer Millipore filter.

The resist system was spun cast onto a one micrometer thick silicon wafer oxide coated 3 inch diameter silicon wafter by spinning at 3000 rpm for 60 seconds. After a 30 minute softbake at 90° C., the film thickness was measured to be 2.4 micrometers and appeared clear and striation-free.

The photomask used in the preceding examples was placed in contact vacuum with the film and the film was exposed to near UV radiation with an intensity of 20 MW/cm$^2$ at 365 nanometers for 4 seconds.

The exposed wafer was immersed in an aqueous developer (Shipley MF 312, an aqueous base containing tetramethyl ammonium hydroxide, diluted six times with deionized water) for 40 seconds with gentle agitation, removed from the developer and dried. The image resolution achieved was 2 micrometers with a film thickness of 0.7 micrometers.

EXAMPLE 5

Preparation of Partially Functionalized Polyglutarimide 15.3 grams of Polymer II of example 4 was dissolved in 225 grams of DMF by heating to 70° C. and stirring under anhydrous conditions for one hour. Five grams of potassium carbonate was added to the solution followed by dropwise addition of 6 grams of allyl bromide. The mixture was stirred and heated at 70° C. for 16 hours. Following this partial functionalization, the polyglutarimide solution was cooled to ambient temperature, and poured with stirring into one liter of water acidified with hydrochloric acid. The white precipitate that formed was filtered through a Whatman No. 1 filter, washed 5 times with 300 ml. of deionized water, air-dried and redissolved in DMF and reprecipitated from water. The precipitate was then stirred with 500 ml. of methanol for 30 minutes, filtered through a Whatman No. 1 filter and dried in vacuum. The product weighed 15.6 grams and was 50% allyl and 50% hydrogen functionalized as determined by NMR Spectrum.

EXAMPLE 6

Use of Partially Functionalized Polyglutarimide Negative Resist

The 50% n-allyl functionalized polyglutarimide of example 5 was used to prepare a negative resist. One gram of the partially functionalized polyglutarimide was dissolved in 5 grams of DMF. 0.08 grams of 4,4'-diazido-stilbene-2,2'-disodium sulfonate was added to the solution, dissolved and filtered through a 0.45 micrometer millipore filter.

A three-inch diameter silicon wafter having one micrometer thick silicon oxide coating was primed with 1 ml. of hexamethyl disilazane by spin casting the primer at 3000 rpm for 30 seconds onto the oxide surface. The resist solution was then spun on top of the primer by spinning at 3000 rpm for 60 seconds. Following a 30 minute soft bake at 90° C., the film had a thickness of 1.25 micrometers and was clear and striation free.

The photomask was placed in contact vacuum with the film as described in the prior examples and the film was exposed to near UV radiation with intensity 20 MW/cm$^2$ at 365 nanometers for 20 seconds. The exposed wafer was then immersed in an aqueous base developer (Shipley 351, an aqueous sodium hydroxide solution, diluted with equal volume of deionized water) for 30 seconds with gentle agitation and was dried. Image resolutions down to 2 micrometers were obtained with a 0.5 micrometer film thickness after development.

EXAMPLE 7

Aqueous Base Polyglutarimide Negative Resist

The polyglutarimide of example 5 ($R_3$=50% allyl and 50% hydrogen) was used to formulate an aqueous base, negative photoresist system. One gram of the partially functionalized polyglutarimide was dissolved in 10 grams of Shipley MF 312 tetramethyl ammonium hydroxide. 0.1 grams of a water soluble, 4,4'-diazidostilbene-2,2'-disodium sulfonate sensitizer dissolved in 2 grams of deionized water with gentle warming to 35° C. The solution was then cooled to 20° C. and it was then added to the polyglutarimide solution, mixed thoroughly, filtered through a 0.45 micrometer Millipore filter and spun coated on a three-inch diameter silicon wafer containing 1 micrometer thick silicon oxide layer. Spinning was conducted at 2000 rpm for 60 seconds. After a 30 minute soft bake of the wafer at 105° C., the resist film thickness was 0.75 micrometers. The film was then exposed through the contact vacuum photomask to near UV radiation with an intensity of 20 MW/cm$^2$ at 365 nanometers for 60 seconds. The wafer was then immersed in an aqueous base developer (Shipley 351 diluted with three times its volume of deionized water) gently agitated for 30 seconds and dried. Image resolutions down to 4 micrometers and a film thickness of 0.2 micrometers was obtained.

EXAMPLE 8

Deep UV Completely Substituted Polyglutarimide Negative Resist (Without Sensitizer)

The starting polymer, Polymer II (in Example 4), was completely substituted with allyl groups ($R_3$=allyl) as in Example 1 using allyl bromide. One gram of the allyl substituted imide was dissolved in 5 grams of dimethylformamide and filtered through a 0.45 micrometer Millipore filter. Two milliliters of the resist system was then pipetted onto a two inch silicon wafer with a one micrometer thick oxide and spun on a Headway Spinner for 60 seconds at 2000 rpm. The film was then softbaked at 90° C. for 30 minutes. The resulting resist film had a thickness of 0.7 micrometer and was clear and striation-free.

The photomask was placed in contact vacuum with the film as described in the previous examples and the film was exposed to deep UV radiation with an intensity of 8 MW/cm$^2$ at 254 nanometers for 20 minutes. The exposed wafer was immersed in dimethylformamide with gentle agitation for 30 seconds and air-dried. Image resolutions down to 1 micrometer were obtained in a 0.7 micrometer thick film after development.

The film was post-baked in an oven at 250° C. for 1 hour. All the images were retained in good condition with the film thickness down to 0.65 micrometer. The wafer was subjected to Reactive Ion Etching using CHF$_3$ plasma. The power density was 1100 watts, the cathode/wafer potential difference was 600 V. While the oxide loss was 0.34 micrometer, the resist loss was only 0.07 micrometer, giving an oxide-to-resist etch ratio of 4.9.

What is claimed is:

1. A process forming an image on a surface comprising depositing a negative acting photoresist film on said surface, said film comprising a polyglutarimide polymer and a negative-acting photosensitizer dissolved in a solvent wherein said polyglutarimide polymer comprises at least about 5 wt% glutarimide units of the formula:

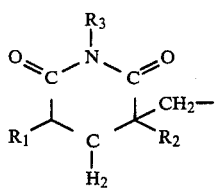

where $R_1$, $R_2$, and $R_3$ independently are hydrogen, unsubstituted and substituted alkyl, aryl, aralkyl or alkaryl hydrocarbons having from one to twenty carbon atoms or mixtures thereof, where at least about 20 mole percent of the $R_3$ substituents are hydrogen and where said negative-acting photosensitizer is selected from the group consisting of photosensitive azides and bisazides and is present in said photoresist at a sufficient quantity to enable the photoresist to become insoluble in an aqueous developer upon exposure of the photoresist to actinic radiation, softbaking said film, exposing a portion of said film to a source of actinic radiation that decreases the dissolution rate of said polyglutarimide in an aqueous developer, and removing the unexposed portion of said film with said aqueous developer to form said image.

2. The process of claim 1 wherein said exposing radiation is selected from the group consisting of near, mid and deep ultraviolet light.

3. A process for forming an image on a surface comprising depositing a negative acting photoresist film on said surface, said film comprising a polyglutarimide polymer dissolved in a solvent wherein said polyglutarimide polymer comprises at least about 5 wt% glutarimide units of the structural formula:

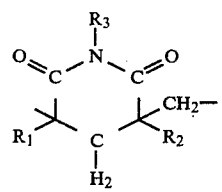

where $R_1$, $R_2$, and $R_3$, prior to functionalization, are hydrogen, unsubstituted and substituted alkyl, aryl, aralkyl or alkaryl hydrocarbons having from one to twenty carbon atoms or mixtures thereof, and where all the $R_3$ hydrogen substitutents are functionalized by reacting said $R_3$ hydrogen substitutents with an unsaturated compound selected from the group consisting of alkenyl halides and alkenyl aromatic halides, soft baking said film, exposing a portion of said film to deep ultra violet light and removing the unexposed portion of said film with an organic developer.

4. The process of claim 3 wherein said alkenyl halide is selected from the group consisting of allyl bromide, crotyl bromide and butenyl bromide.

5. The process of claim 3 wherein said alkenyl aromatic halide is cinnamyl bromide.

6. The process of claim 3 where the film further comprises an effective amount of an organic solvent-soluble, negative acting photosensitizer.

* * * * *

UNITED STATES PATENT AND TRADEMARK OFFICE
CERTIFICATE OF CORRECTION

PATENT NO. : 4,631,249
DATED : 12/23/86
INVENTOR(S) : Paliyur S. Kalyanaraman

It is certified that error appears in the above-identified patent and that said Letters Patent is hereby corrected as shown below:

Column 11 of claim 1 formula should read as follows:

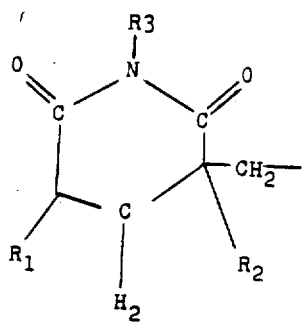

Signed and Sealed this

Sixth Day of October, 1987

Attest:

DONALD J. QUIGG

Attesting Officer

Commissioner of Patents and Trademarks